United States Patent
Huang et al.

(10) Patent No.: US 11,005,008 B2
(45) Date of Patent: May 11, 2021

(54) METHOD FOR MANUFACTURING LIGHT EMITTING DEVICE

(71) Applicant: Xiamen San'An Optoelectronics Co., Ltd., Fujian (CN)

(72) Inventors: Senpeng Huang, Fujian (CN); Zhen-duan Lin, Fujian (CN); Weng-Tack Wong, Fujian (CN); Junpeng Shi, Fujian (CN); Shunyi Chen, Fujian (CN); Chih-Wei Chao, Fujian (CN); Chen-ke Hsu, Fujian (CN)

(73) Assignee: Xiamen San'An Optoelectronics Co., Ltd., Fujian (CN)

( * ) Notice: Subject to any disclaimer, the term of this patent is extended or adjusted under 35 U.S.C. 154(b) by 0 days.

(21) Appl. No.: 16/452,602

(22) Filed: Jun. 26, 2019

(65) Prior Publication Data

US 2019/0319169 A1 Oct. 17, 2019

Related U.S. Application Data

(63) Continuation-in-part of application No. PCT/CN2018/081668, filed on Apr. 3, 2018.

(30) Foreign Application Priority Data

Aug. 11, 2017 (CN) .......................... 201710685818.5

(51) Int. Cl.
*H01L 33/00* (2010.01)
*H01L 33/22* (2010.01)
(Continued)

(52) U.S. Cl.
CPC .......... *H01L 33/22* (2013.01); *H01L 33/0095* (2013.01); *H01L 33/44* (2013.01);
(Continued)

(58) Field of Classification Search
CPC ....... H01L 33/44; H01L 33/505; H01L 33/60; H01L 33/54; H01L 33/22; H01L 33/0095;
(Continued)

(56) References Cited

U.S. PATENT DOCUMENTS 7,157,745 B2 * 1/2007 Blonder ................ H01L 33/507
257/100
7,855,389 B2 * 12/2010 Ishikura .............. H01L 25/0753
257/79
(Continued)

FOREIGN PATENT DOCUMENTS

CN 1224533 A 7/1999
CN 106129231 A 11/2016
(Continued)

OTHER PUBLICATIONS

"Modern Tribology Handbook: vol. One" edited by Bharat Bhushan, CRC Press, 2000 at http://home.ufam.edu.br/berti/nanomateriais/8403_PDF_CH02.pdf (Year: 2001).*
(Continued)

*Primary Examiner* — Nikolay K Yushin
(74) *Attorney, Agent, or Firm* — Thomas|Horstemeyer, LLP

(57) ABSTRACT

A light emitting device includes an LED chip, a light-transmissible member and a light-reflecting member. The LED chip has a plurality of interconnecting side surfaces having a roughened structure and a plurality of corners. The light-transmissible member covers the side surfaces and the corners and includes a light-transmissible material layer having a breadth value W(A) of a viscosity coefficient (A) range of the light-transmissible material, which satisfies a relation of W(A)∝B*D/C: where B represents a thickness of the light-transmissible material layer, represents a thickness of the LED chip measured from the first surface to the second surface, and D represents a roughness of the rough-
(Continued)

ened structure. A method for manufacturing the light emitting device is also provided.

30 Claims, 6 Drawing Sheets

(51) Int. Cl.
*H01L 33/44* (2010.01)
*H01L 33/50* (2010.01)
*H01L 33/54* (2010.01)
*H01L 33/60* (2010.01)

(52) U.S. Cl.
CPC ............ *H01L 33/505* (2013.01); *H01L 33/54* (2013.01); *H01L 33/60* (2013.01); *H01L 2933/005* (2013.01); *H01L 2933/0041* (2013.01); *H01L 2933/0058* (2013.01)

(58) Field of Classification Search
CPC ........... H01L 33/005; H01L 2933/0041; H01L 2933/0058; H01L 2933/005
See application file for complete search history.

(56) References Cited

U.S. PATENT DOCUMENTS

| | | | |
|---|---|---|---|
| 8,896,010 B2 * | 11/2014 | Tischler | H01L 24/96 257/98 |
| 9,000,466 B1 * | 4/2015 | Aldaz | |
| 9,859,480 B2 * | 1/2018 | Naka | |
| 9,966,514 B2 * | 5/2018 | Hsu | H01L 33/62 |
| 2004/0257797 A1 | 12/2004 | Suehiro et al. | |
| 2005/0224830 A1 * | 10/2005 | Blonder | H01L 33/507 257/100 |
| 2013/0200413 A1 | 8/2013 | Kashiwagi et al. | |
| 2014/0175481 A1 * | 6/2014 | Tischler | H01L 24/96 257/98 |
| 2015/0048402 A1 | 2/2015 | Urano et al. | |
| 2017/0005245 A1 * | 1/2017 | Hsu | H01L 33/62 |
| 2017/0030551 A1 | 2/2017 | Chiu | |
| 2017/0054061 A1 * | 2/2017 | Naka | |

FOREIGN PATENT DOCUMENTS

| | | |
|---|---|---|
| CN | 107482096 A | 12/2017 |
| TW | 475276 B | 2/2002 |
| TW | 201345005 A | 11/2013 |
| TW | 201717433 A | 5/2017 |

OTHER PUBLICATIONS

Zhou et al., "Observation of subsurface monolayer thickness fluctuations . . . ", 2004, Applied Physics Letters vol. 85, No. 3, pp. 407-409, published on Jul. 19, 2004 (Year: 2004).*
Search Report issued to PCT application No. PCT/CN2018/081668 by the CNIPA dated Jul. 9, 2018.
Search Report appended to an Office Action, which was issued to Taiwanese counterpart application No. 107102511 by the TIPO dated Jun. 26, 2018, with an English translation thereof.

* cited by examiner

METHOD FOR MANUFACTURING LIGHT EMITTING DEVICE

CROSS-REFERENCE TO RELATED APPLICATION

This application is a continuation-in-part (CIP) of International Application No. PCT/CN2018/081668 filed on Apr. 3, 2018, which claims priority of Chinese Invention Patent Application No. 201710685818.5, filed on Aug. 11, 2017.

FIELD

The disclosure relates to a light emitting device and a method for manufacturing the same, and more particularly to a light emitting device including a light emitting diode (LED) chip formed with a light-transmissible member and a method manufacturing the same.

BACKGROUND

A conventional chip-scale package (CSP) light emitting device for single-sided light emission usually has a relatively good beam pattern to meet the miniaturization trend. Referring to FIG. 1, one type of the conventional DSP light emitting device for single-sided emission includes an LED chip 91, two electrodes 92, a light-reflecting material layer 93, and a wavelength conversion material layer 94. Since light emitted from a side surface of the CSP light emitting device is blocked by the light-reflecting material layer 93, the luminous flux of such CSP light emitting device is relatively low.

Referring to FIGS. 2 and 3, another type of the conventional CSP light emitting device for single-sided light emission includes a LED chip 91' that has a front surface 97, a rear surface 98 and a side surface 96 interconnected between the front and rear surfaces 97, 98, a wavelength conversion layer 94' disposed on the front surface 97, a pair of spaced-apart electrodes 92' disposed on the rear surface 98, a transparent material layer 95 that covers the side surface 96 and that is tapered from the wavelength conversion layer 94' toward the rear surface 98, and a light-reflecting material layer 93' connected to the wavelength conversion layer 94' and the transparent material layer 95. The light-reflecting material layer 93' is capable of reflecting light exiting from the side surface 96 toward the front surface 97 so as to increase the luminous flux of the CSP light emitting device.

However, conventional methods for manufacturing such CSP light emitting device for single-sided light emission cannot ensure that the side surface 96 of the LED chip 91' is completely covered by the transparent material layer 95. When the coverage of the side surface 96 by the transparent material layer 95 is incomplete, the light exiting from the side surface 96 may not be fully reflected toward the front surface 97 by the light-reflecting material layer and thus affecting the front light extraction efficiency of the conventional CSP light emitting device. In view of the aforesaid limitations, the front light extraction efficiency of the conventional CSP light emitting devices produced in the same batch by the conventional methods may be non-uniform, which detrimentally affects the manufacturing yield of the conventional CSP light emitting devices.

SUMMARY

Therefore, an object of the disclosure is to provide a light emitting device and a method for manufacturing the same, which can alleviate at least one of the drawbacks of the prior art.

According to one aspect of the present disclosure, a light emitting device includes an LED chip, a light-transmissible member and a light-reflecting member.

The LED chip has a first surface, a second surface opposite to the first surface, two electrodes disposed on the second surface, a plurality of interconnecting side surfaces each connected between the first surface and the second surface, and a plurality of corners. Each of the corners is correspondingly defined by adjacent two of the side surfaces and the second surface. The side surfaces have a roughened structure.

The light-transmissible member covers the side surfaces and the corners, and is made from a light-transmissible material layer.

The light-reflecting member surrounds the light-transmissible member.

The light-transmissible material layer has a breadth value W(A) of a viscosity coefficient (A) range which is defined by a difference between upper and lower limits of the viscosity coefficient (A) range of the light-transmissible material layer. The breadth value satisfies a relation of W(A)∝B*D/C, where B represents a thickness of the light-transmissible material layer, C represents a thickness of the LED chip measured from the first surface to the second surface of the LED chip, and D represents a roughness of the roughened structure of the side surfaces of the LED chip.

According to another aspect of the present disclosure, a method for manufacturing a light emitting device includes the following steps:

providing at least one LED chip that has opposite first and second surfaces, two electrodes disposed on the second surface, a plurality of interconnecting side surfaces formed with a roughened structure and each connected between the first and second surfaces, and a plurality of corners, each of the corners being correspondingly defined by adjacent two of the side surfaces and the second surface;

forming a light-transmissible material layer on a wavelength conversion member;

attaching the at least one LED chip to the wavelength conversion member and the light-transmissible material layer with the first surface of the LED chip attached to the wavelength conversion member and with the side surfaces and the corners attached to the light-transmissible material layer;

curing the light-transmissible material layer to form a light-transmissible member that covers the side surfaces and the corners; and surrounding forming a light-reflecting member on the light-transmissible member.

The light-transmissible material layer has a breadth value W(A) of a viscosity coefficient (A) range which is defined by a difference between upper and lower limits of the viscosity coefficient (A) range of the light-transmissible material layer. The breadth value satisfies a relation of W(A)∝B*D/C, where B represents a thickness of the light-transmissible material layer measured from the wavelength conversion member, C represents a thickness of the LED chip measured from the first surface to the second surface thereof, and D represents a roughness of the roughened structure of the side surfaces of the LED chip.

BRIEF DESCRIPTION OF THE DRAWINGS

Other features and advantages of the disclosure will become apparent in the following detailed description. of the embodiment (s) with reference to the accompanying drawings, of which.

DETAILED DESCRIPTION

Figure 1:
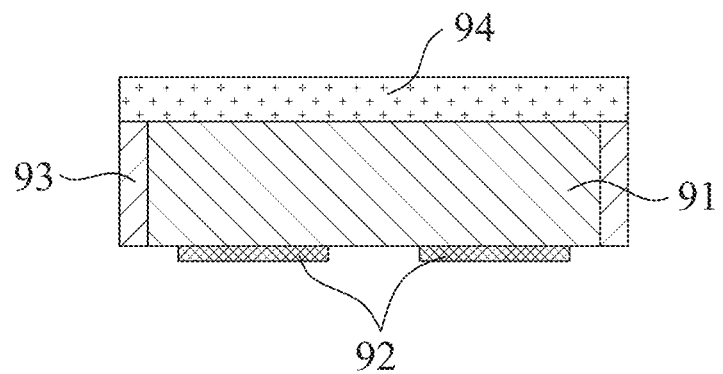
FIG. 1 is a schematic view illustrating a conventional CSP light emitting device.
Figure 2:
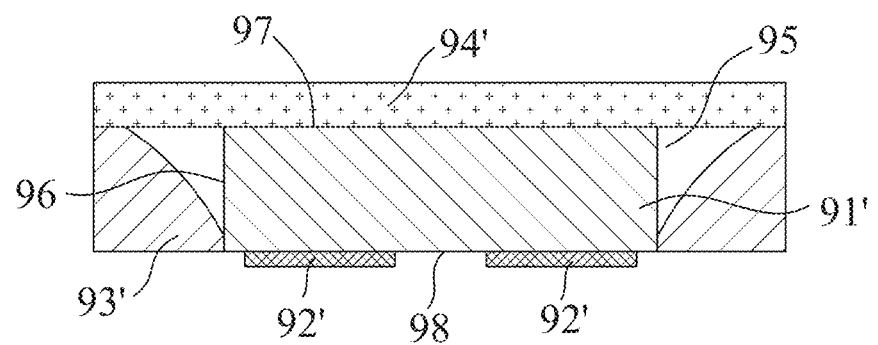
FIG. 2 is a schematic view illustrating another conventional CSP light emitting device.
Figure 3:
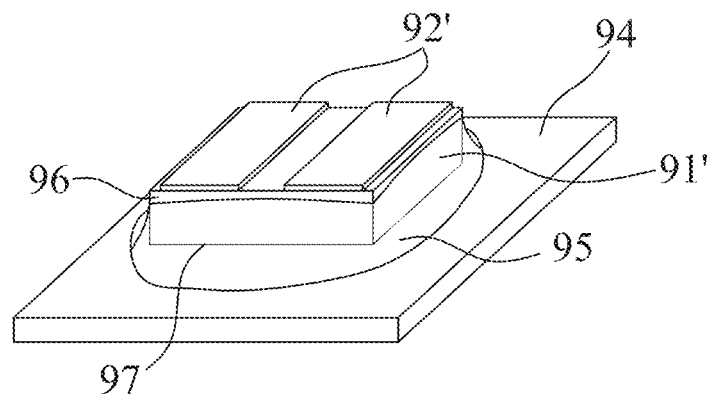
FIG. 3 is a perspective view of the CSP light emitting device of FIG. 2 with a light-reflecting material layer omitted.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 4:
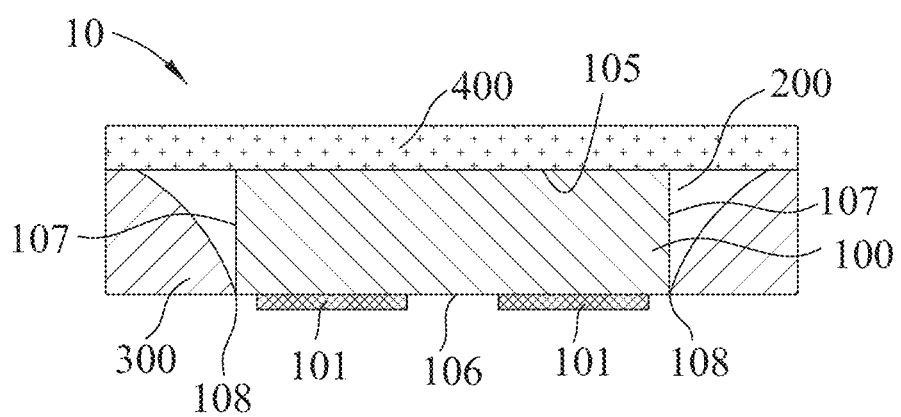
FIG. 4 is a schematic view of an embodiment of a light emitting device according to the disclosure.
Figure 5:
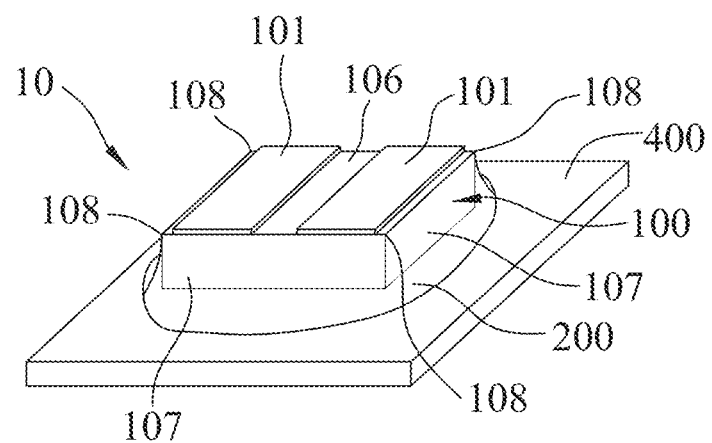
FIG. 5 is a perspective view of the light emitting device of FIG. 4 with a light-reflecting member omitted.

Referring to FIGS. 4 and 5, an embodiment of a light emitting device 10 according to the disclosure includes an LED chip 100, a light-transmissible member 200, a light-reflecting member 300, and a wavelength conversion member 400.

The LED chip 100 has a first surface 105, a second surface 106, two electrodes 101, a plurality of interconnecting side surfaces 107, and a plurality of corners 108. The second surface 106 is opposite to the first surface 105. Each of the side surfaces 107 is connected between the first and second surfaces 105 and 106. Each of the corners 108 is correspondingly defined by adjacent two of the side surfaces 107 and the second surface 106. The two electrodes 101 are disposed on the second surface 106 and a roughened structure 104 (see FIGS. 6 and 7) is formed on the side surfaces 107.

The light-transmissible member 200 is made from a light-transmissible material layer 200' (see FIG. 8), covers the side surfaces 107 and the corners 108 and is surrounded by the light-reflecting member 300. The wavelength conversion member 400 is disposed on the first surface 105 of the LED chip 100, the light-transmissible member 200 and the light-reflecting member 300. During operation, the LED chip 100 is powered to emit a first light that passes through and excites the wavelength conversion member 400 to emit a second light with a different color. Then, the first and second lights are mixed to form a light mixture that emits outward to the environment.

The light-transmissible material layer 200' has a breadth value (W(A)) of a viscosity coefficient (A) range which is defined by a difference between upper and lower limits of the viscosity coefficient (A) range. In order to make the light-transmissible material layer 200' fully covering the side surfaces 107 and the corners 108, the breadth value (W(A)) must satisfy a relation of W(A)∝B*D/C, where B represents a thickness of the light-transmissible material layer 200' measured from the wavelength conversion member 400, C represents a thickness of the LED chip 100 measured from the first surface 105 to the second surface 106 of the LED chip 100, and D represents a roughness of the roughened structure 104 of the side surfaces 107. That is, the breadth value (W(A)) is proportional to a value of B*D/C. Detailed description for such relationship will be provided in the following context.

In one form, the thickness (B) of the light-transmissible material layer 200' ranges from 10 μm to 60 μm, the thickness (C) of the LED chip 100 ranges from 150 μm to 200 μm, and the roughness (D) of the roughened structure 104 ranges from 0.01 μm to 2 μm.

Figure 6:
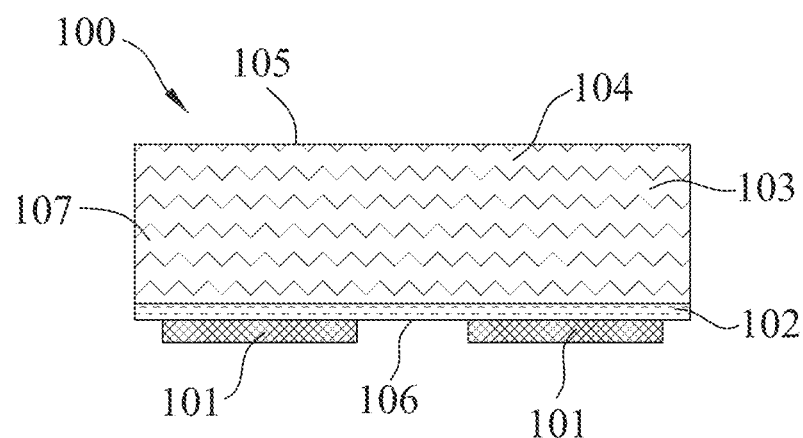
FIG. 6 is a schematic view illustrating a roughened structure of side surfaces of an LED chip of the light emitting device of FIG. 4.
Figure 7:
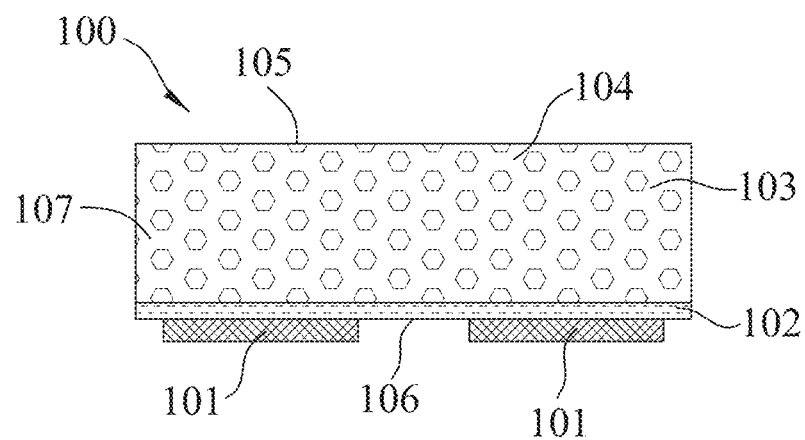
FIG. 7 is a schematic view illustrating a variation of the LED chip of the light emitting device of FIG. 4.

As shown in FIGS. 6 and 7, in this embodiment, the light emitting device 10 is a chap scale package (CSP) light emitting device, and the LED chip 100 has a flip chip structure. The LED chip 100 includes a substrate 103 defining the first surface 105 and a semiconductor epitaxial layer 102 that is formed on the substrate 103 and that defines the second surface 106. The side surfaces 107 of the LED chip 100 may be defined by a side surface of the substrate 103, a side surface of the semiconductor epitaxial layer 102, or combinations thereof. The roughened structure 104 of the side surfaces 107 may have one of a periodic arrangement and a non-periodic arrangement.

Referring back to FIG. 6, the roughened structure 104 may be formed by stealth dicing the LED chip 100 with a focused laser beam at different focusing depths. The different focusing depths are spaced apart from one another by a spacing ranging from 30 μm to 80 μm. In certain embodiments, the spacing ranges from 50 μm to 60 μm. For LED chip 100 having a thickness of 150 μm to 200 μm, the roughened structure 104 is formed by stealth dicing the side surfaces of the substrate 103 for 3 to 4 times at different focusing depths.

Referring back to FIG. 7, the roughened structure 104 of the side surfaces 107 may be obtained through surface modification by forming microstructures on the side surfaces 107. The microstructures may be formed by disposing particles, which may have a diameter ranging from 5 nm to 5 μm, on the side surfaces 107 through spraying, bonding, deposition and etc. Examples of the particles may include, but are not limited to, a non-conductive inorganic material such as silicon dioxide, titanium dioxide, zirconium dioxide, aluminum oxide, boron nitride, or a non-conductive organic material such as polymethylsilsesquioxane. In certain embodiments, the particles of the non-conductive inorganic material may have a diameter ranging from 5 nm to 50 nm. In some embodiments, the particles of the non-conductive organic material may have a diameter ranging from 0.5 nm to 2 μm. Referring back to FIGS. 4 and 6, since the side surfaces 107 of the LED chip 100 have the roughened structure 104, the effective contact area between the side surfaces 107 of the LED chip 100 and the light-transmissible material layer 200' (see FIG. 8) can be increased. Thus, the bonding strength of the LED chip 100 to the light-transmissible member 200 can be enhanced, thereby improving the surface wettability of the side surfaces 107 to the light-transmissible material layer 200', and facilitating complete covering of the side surfaces 107 of the LED chip 100 by the light-transmissible material layer 200'. That is, the light-transmissible layer 200' may pervade the side surfaces 107 entirely so as to reach the second surface 106 and cover the corners 108.

As shown in FIGS. 8 to 12, an embodiment of a method for manufacturing a plurality of the light emitting devices 10 is illustrated.

Figure 8:
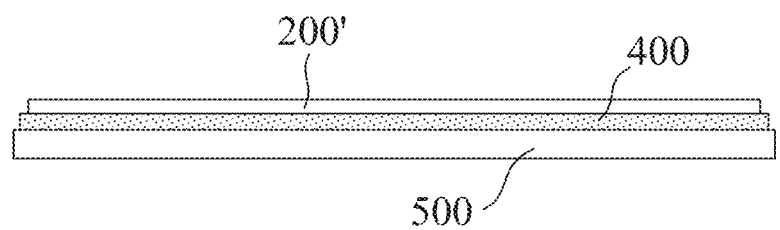
FIGS. 8 to 12 are schematic views illustrating consecutive steps of an embodiment of a method for manufacturing a light emitting device according to the disclosure.
Figure 9:
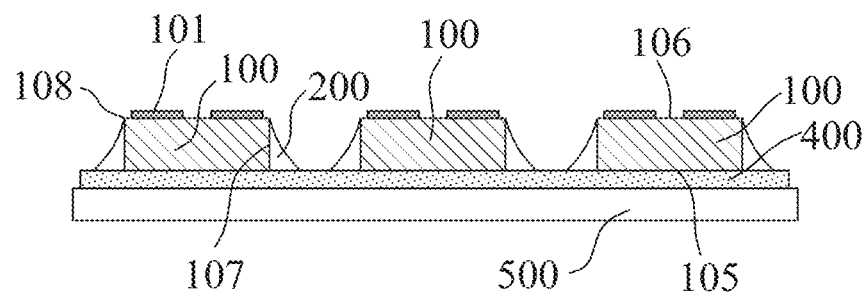

As shown in FIG. 8, the wavelength conversion member 400 is attached to a temporary substrate 500 that may have marks. The wavelength conversion member 400 may have a thickness ranging from 10 μm to 200 μm. Examples of a material suitable for making the wavelength conversion member 400 may include, but are not limited to, a fluorescent film, a glass fluorescent sheet and a ceramic fluorescent sheet. Examples of a material suitable for making the temporary substrate 500 may include, but are not limited to, stainless steel, ceramics, glass, plastics and other polymer composite materials. Thereafter, the light-transmissible material layer 200' is formed on the wavelength conversion member 400 by coating the wavelength conversion member 400 with a liquid light-transmissible material. As mentioned above, the light-transmissible material layer 200' may have a thickness ranging from 10 μm to 60 μm, which will be determined based on the thickness (C) of the LED chip 100. For example, if the LED chip 100 has a thickness of 150 μm, the light-transmissible layer 200' may have a thickness of 30 μm.

Next, as shown in 9, a plurality of the LED chips 100, each having flip chip structure and includes the first and second surfaces 105, 106, the electrodes 101, the side surfaces 107 and the corners 108 as illustrated above, are prepared and attached to the wavelength conversion member 400 and the light-transmissible material layer 200' in a liquid state. The first surfaces 105 of the LED chips 100 are attached to the wavelength conversion member 400, and the electrodes 101 are disposed away from the wavelength conversion member 400. The side surfaces 107 and the corners 108 of the LED chips 100 are attached to the light-transmissible material layer 200'. Then, the light-transmissible material layer 200' is cured by heating. The LED chips 100 are separated from one another by a spacing determined based on the size and thickness thereof. For example, if each of the LED chips 100 has a surface area of 40 mil*40 mil and a thickness of 150 μm, the LED chips 100 may have spacings of 1.6 mm there among.

For selection of the light-transmissible material layer 200', the viscosity coefficient (A) is an important factor affecting the coverage of the side surfaces 107 of the LED chips 100 by the light-transmissible member 200. As mentioned above, viscosity when she coefficient (A) of the light-transmissible material layer 200' is controlled to satisfy the breadth value (W(A)), and when the breadth value (W(A)) satisfies the relation of W(A) ∝B*D/C, the light-transmissible member 200 may fully cover the side surfaces 107 of the LED chips 100. Specifically, the greater the thickness (IB) of the light-transmissible material layer 200' or the roughness (D) of the roughened structures 104 is, the greater the breadth value (W(A)) of the viscosity coefficient range of the light-transmissible material layer 200' is. Increasing the breadth value (W(A)) may enable full coverage of the side surfaces 107 by the light-transmissible member 200. On the other hand, when the thickness (C) of the LED chip 100 is relatively small, the breadth value (W(A)) of the viscosity coefficient (A) range of the light-transmissible material layer 200' increases. When the thickness of the LED chips 100 is relatively large, full coverage of the side surfaces 107 of the LED chips 100 with the light-transmissible member 200 may be achieved by increasing the roughness (D) of the roughened structure 104 of the side surfaces 107 thereof.

For a conventional LED chip without a roughened structure formed on the side surface thereof, the light-transmissible material layer is restricted to have a viscosity coefficient ranging from 2500 mPa·s to 4000 mPa·s, which is unable to sufficiently cover the side surface of the conventional LED chip. In contrast, each of the LED chips 100 has the roughened structure 104 of the side surfaces 107, so that the breadth value (W(A)) of the viscosity coefficient (A) range of the light-transmissible layer 200' is broadened. In one embodiment, when the viscosity coefficient (A) of the light-transmissible material layer 200' ranges from 1000 mPa·s to 6000 mPa·s, the light-transmissible member 200 thus formed is tapered from the wavelength conversion member 400 toward the second surface 106 of each of the LED chips 100, i.e., exhibiting an inverted-cone appearance. In another embodiment, the light-transmissible material layer 200' may have a viscosity coefficient (A) ranging from 3000 mPa·s to 4000 mPa·s at room temperature. Compared with the light-transmissible material layer of the conventional LED chip, the breadth value ((W(A)) of the viscosity coefficient (A) range of the light-transmissible material layer 200' is tripled.

In addition, the curing of the light-transmissible material layer 200' may be performed by stepwise heating so as to effectively improve structural uniformity of the light-transmissible member 200 having the inverted-cone appearance. For example, when the light-transmissible material layer 200' is made from a liquid silicone rubber, the stepwise heating includes heating at 50° C. for 15 minutes, followed by heating at 70° C. for 15 minutes, and then heating at 150° C. for 30 minutes. Depending on the flowability of the light-transmissible material layer 200', the stepwise heating of the light-transmissible material layer 200' may adopt different temperature rising rates.

The stepwise heating enables the viscosity coefficient (A) range of the light-transmissible material layer 200' during the curing to be controlled within a range of 1000 mPa·s to 1500 mPa·s for 10 minutes to 60 minutes, for example, heating at 50° C. for 15 minutes. A lower range of the viscosity coefficient (A) is beneficial to the flowability of the light-transmissible material layer 200' on the side surfaces 107 of the LED chips 100 and the wavelength conversion member 400, so that full coverage of the side surfaces 107 of the LED chips 100 by the light-transmissible member 200 may be achieved. When the light emitting device 10 of the disclosure are produced in batches, the improved flowability of the light-transmissible material layer 200' also enhances the structural uniformity of the light-transmissible member 200 having the inverted-cone appearance.

Figure 10:
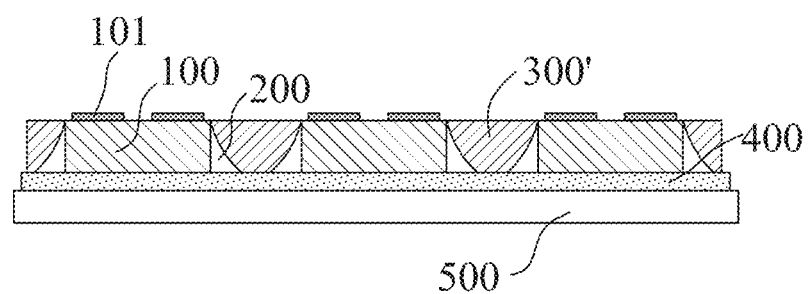

Next, as shown in FIG. 10, a light-reflecting material layer 300' is applied onto the light-transmissible member 200 and then cured to surroundingly form the light-reflecting member 300 on the light-transmissible member 200.

Figure 11:
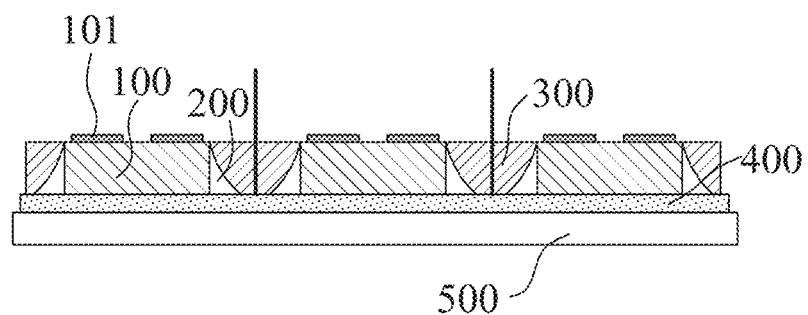
Figure 12:
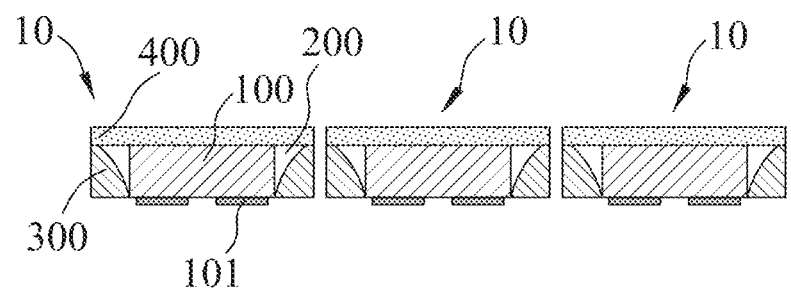

Then, as shown in FIG. 11, the temporary substrate 500 is removed by cutting the light-reflecting member 300 and the wavelength conversion member 400 among the LED chips 100 so as to form a plurality light emitting units (see FIG. 12). It will be understood that the thus obtained light emitting units may independently include one or more of the light emitting device 10.

Alternatively, the formation of the light-transmissible material layer 200' on the wavelength conversion member 400 may be conducted by dispensing or printing so that the light-transmissible material layer 200' has a plurality of spaced-apart sections. When the LED chips 100 are subsequently attached to the light-transmissible material layer 200', the spaced-apart sections of the light-transmissible material layer 200' may cover the second surfaces 106 and the corners 108 of the LED chips 100.

To sum up, by virtue of a structural design of the light emitting device 10 and a method for manufacturing the same according to the disclosure, full coverage of the side surfaces 107 of the LED chip 100 by the light-transmissible member 200 may be achieved, the light-transmissible member 200 also covers the corners 108 so that luminous flux and uniformity of the front light extraction efficiency of the light emitting device 10 can be achieved, thereby increasing the manufacturing yield of the light emitting device 10 in the form of the CSP light emitting device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for manufacturing a light emitting device, comprising:
    providing at least one light emitting diode (LED) chip having opposite first and second surfaces, two electrodes disposed on the second surface, a plurality of interconnecting side surfaces formed with a roughened structure and each connected between the first and second surfaces, and a plurality of corners, each of the corners being correspondingly defined by adjacent two of the side surfaces and the second surface;
    forming a light-transmissible material layer on a wavelength conversion member;
    attaching the at least one LED chip to the wavelength conversion member and the light-transmissible material layer with the first surface of the LED chip attached to the wavelength conversion member and with the side surfaces and the corners attached to the light-transmissible material layer, the roughened structure of the side surfaces increasing effective contact area between the side surfaces and the light-transmissible material layer;
    curing the light-transmissible material layer to form a light-transmissible member that covers the side surfaces and the corners; and
    surroundingly forming a light-reflecting member on the light-transmissible member;
    wherein the light-transmissible material layer is made of a light-transmissible material layer having a viscosity coefficient ranging between 1000 mPa·s and 6000 mPa·s, and
    wherein the curing of the light-transmissible material layer is performed by stepwise heating.

2. The method of claim 1, wherein the provision of the at least one LED chip includes providing a plurality of the LED chips, the method further comprising cutting the light-reflecting member and the wavelength conversion member among the LED chips.

3. The method of claim 1, wherein the stepwise heating includes heating at 50° C. for 15 minutes, followed by heating at 70° C. for 15 minutes, and then heating at 150° C. for 30 minutes.

4. The method of claim 1, wherein the curing of the light-transmissible material layer is performed by controlling the viscosity coefficient of the light-transmissible material layer to be within 1000 mPa·s to 1500 mPa·s for 10 to 60 minutes.

5. The method of claim 1, wherein of the light-transmissible material layer has a thickness ranging from 10 μm to 60 μm.

6. The method of claim 1, wherein the LED chip has a thickness ranging from 150 μm to 200 μm.

7. The method of claim 1, wherein the roughened structure has a roughness ranging from 0.01 μm to 2 μm.

8. The method of claim 1, wherein the roughened structure has one of a periodic arrangement and a non-periodic arrangement.

9. The method of claim 1, wherein the provision of the at least one LED chip includes forming the roughened structure by one of stealth dicing and surface modification.

10. The method of claim 9, wherein the roughened structure is formed by the stealth dicing with a focused laser beam at different focusing depths, the focusing depths being spaced apart from one another by a spacing ranging from 30 μm to 80 μm.

11. The method of claim 9, wherein the surface modification is selected from spraying with particles, bonding with particles, and deposition with particles.

12. A method for manufacturing a light emitting device, comprising:
    providing at least one light emitting diode (LED) chip having opposite first and second surfaces, two electrodes disposed on the second surface, a plurality of interconnecting side surfaces formed with a roughened structure and each connected between the first and second surfaces, and a plurality of corners, each of the corners being correspondingly defined by adjacent two of the side surfaces and the second surface;
    forming a light-transmissible material layer on a wavelength conversion member;
    attaching the at least one LED chip to the wavelength conversion member and the light-transmissible material layer with the first surface of the LED chip attached to the wavelength conversion member and with the side surfaces and the corners attached to the light-transmissible material layer, the roughened structure of the side surfaces increasing effective contact area between the side surfaces and the light-transmissible material layer;
    curing the light-transmissible material layer to form a light-transmissible member that covers the side surfaces and the corners; and
    surroundingly forming a light-reflecting member on the light-transmissible member;
    wherein the light-transmissible material layer is made of a light-transmissible material layer having a viscosity coefficient ranging between 1000 mPa·s and 6000 mPa·s, and
    wherein the curing of the light-transmissible material layer is performed by controlling the viscosity coefficient of the light-transmissible material layer to be within 1000 mPa·s to 1500 mPa·s for 10 to 60 minutes.

13. The method of claim 12, wherein the provision of the at least one LED chip includes providing a plurality of the LED chips, the method further comprising cutting the light-reflecting member and the wavelength conversion member among the LED chips.

14. The method of claim 12, wherein the curing of the light-transmissible material layer is performed by stepwise heating which includes heating at 50° C. for 15 minutes, followed by heating at 70° C. for 15 minutes, and then heating at 150° C. for 30 minutes.

15. The method of claim 12, wherein the light-transmissible material layer has a thickness ranging from 10 μm to 60 μm.

16. The method of claim 12, wherein the LED chip has a thickness ranging from 150 μm to 200 μm.

17. The method of claim 12, wherein the roughened structure has a roughness ranging from 0.01 μm to 2 μm.

18. The method of claim 12, wherein the roughened structure has one of a periodic arrangement and a non-periodic arrangement.

19. The method of claim 12, wherein the provision of the at least one LED chip includes forming the roughened structure by one of stealth dicing and surface modification.

20. The method of claim 19, wherein the roughened structure is formed by the stealth dicing with a focused laser beam at different focusing depths, the focusing depths being spaced apart from one another by a spacing ranging from 30 μm to 80 μm.

21. The method of claim 19, wherein the surface modification is selected from spraying with particles, bonding with particles, and deposition with particles.

22. A method for manufacturing a light emitting device, comprising:
providing at least one light emitting diode (LED) chip having opposite first and second surfaces, two electrodes disposed on the second surface, a plurality of interconnecting side surfaces formed with a roughened structure and each connected between the first and second surfaces, and a plurality of corners, each of the corners being correspondingly defined by adjacent two of the side surfaces and the second surface;
forming a light-transmissible material layer on a wavelength conversion member;
attaching the at least one LED chip to the wavelength conversion member and the light-transmissible material layer with the first surface of the LED chip attached to the wavelength conversion member and with the side surfaces and the corners attached to the light-transmissible material layer, the roughened structure of the side surfaces increasing effective contact area between the side surfaces and the light-transmissible material layer;
curing the light-transmissible material layer to form a light-transmissible member that covers the side surfaces and the corners; and
surroundingly forming a light-reflecting member on the light-transmissible member;
wherein the light-transmissible material layer is made of a light-transmissible material layer having a viscosity coefficient ranging between 1000 mPa·s and 6000 mPa·s, and
wherein the provision of the at least one LED chip includes forming the roughened structure by one of stealth dicing and surface modification.

23. The method of claim 22, wherein the provision of the at least one LED chip includes providing a plurality of the LED chips, the method further comprising cutting the light-reflecting member and the wavelength conversion member among the LED chips.

24. The method of claim 22, wherein the curing of the light-transmissible material layer is performed by stepwise heating which includes heating at 50° C. for 15 minutes, followed by heating at 70° C. for 15 minutes, and then heating at 150° C. for 30 minutes.

25. The method of claim 22, wherein the light-transmissible material layer has a thickness ranging from 10 μm to 60 μm.

26. The method of claim 22, wherein the LED chip has a thickness ranging from 150 μm to 200 μm.

27. The method of claim 22, wherein the roughened structure has a roughness ranging from 0.01 μm to 2 μm.

28. The method of claim 22, wherein the roughened structure has one of a periodic arrangement and a non-periodic arrangement.

29. The method of claim 22, wherein the roughened structure is formed by the stealth dicing with a focused laser beam at different focusing depths, the focusing depths being spaced apart from one another by a spacing ranging from 30 μm to 80 μm.

30. The method of claim 22, wherein the surface modification is selected from spraying with particles, bonding with particles, and deposition with particles.

* * * * *